(12) United States Patent
Cai

(10) Patent No.: US 7,575,449 B1
(45) Date of Patent: Aug. 18, 2009

(54) ELECTRICAL CONNECTOR

(75) Inventor: Chaowen Cai, Yiyang (CN)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 12/216,394

(22) Filed: Jul. 3, 2008

(51) Int. Cl.
*H01R 13/44* (2006.01)

(52) U.S. Cl. ................. 439/135; 439/940

(58) Field of Classification Search ........... 439/135, 439/331, 940, 73
See application file for complete search history.

(56) References Cited

U.S. PATENT DOCUMENTS

| | | | |
|---|---|---|---|
| 6,413,111 B1 * | 7/2002 | Pickles et al. | 439/342 |
| 6,533,592 B1 * | 3/2003 | Chen et al. | 439/135 |
| 6,939,140 B2 * | 9/2005 | Liao | 439/41 |
| 6,971,890 B2 * | 12/2005 | Ma | 439/135 |
| 6,974,346 B2 * | 12/2005 | Liao | 439/342 |
| 7,029,295 B2 * | 4/2006 | Liao | 439/135 |
| 7,033,183 B2 * | 4/2006 | Ma et al. | 439/41 |
| 7,033,188 B2 * | 4/2006 | Ma | 439/135 |
| 7,090,517 B2 * | 8/2006 | Ma | 439/135 |
| 7,140,890 B1 * | 11/2006 | Ju | 439/135 |
| 7,264,487 B2 * | 9/2007 | Liao | 439/135 |
| 7,367,822 B2 * | 5/2008 | Ma | 439/135 |
| 7,390,202 B2 * | 6/2008 | Ma et al. | 439/135 |
| 2005/0009377 A1 * | 1/2005 | Liao | 439/41 |

\* cited by examiner

*Primary Examiner*—Neil Abrams
*Assistant Examiner*—Harshad C Patel
(74) *Attorney, Agent, or Firm*—Rosenberg, Klein & Lee

(57) ABSTRACT

An electrical connector includes: a fastener having an upper cover, a lower cover and a lever, the upper cover having a first side and a second side opposite to each other, the first side extending to form two pivoting ends pivotingly connected to the lower cover, the second side extending to form a clipping portion, the lever pressing the clipping portion, the lever being pivotingly connected with the lower cover; a cover plate covering the upper cover, both ends of one side of the cover plate being provided with a protruding portion respectively on which a first positioning portion is provided for engaging with the second side of the upper cover, the other side of the cover plate being provided with a set of second positioning portions for engaging with the first side of the upper cover. Thus the production yield is increased, and it is suitable for mass production.

8 Claims, 6 Drawing Sheets

ELECTRICAL CONNECTOR

BACKGROUND OF THE INVENTION

1. Field of the Invention

The present invention relates to an electrical connector on which a cover plate is provided, whereby vacuum equipment can be used to transport the connector during manufacture.

2. Description of Related Art

With the mechanized manufacture in electronic elements, the vacuum suction technology is widely used in the mechanically mounting process of various electronic elements. In such a process, at first, a cover plate is fixed on an electronic element, and then a vacuum suction device suck a top surface of the cover plate. When adhesion of the vacuum suction device to the cover plate is achieved, the electronic element will follow the movements of the vacuum suction device and thereby be brought to a predetermined position on a circuit board. Finally, the electronic element is welded to the predetermined position of the circuit board. Please refer to FIG. 1, which is a schematic view showing a cover plate 10a and an upper cover 20a of an electronic connector in the prior art. The ends on both sides of the cover plate 10a are provided with a protruding block 11a respectively. The protruding block 11a is provided thereon with a locking point 110a. The locking point 110a engages with the upper cover 20a of the electronic connector, thereby fixing the cover plate 10a and the upper cover 20a of the electronic connector. The upper cover 20a includes a first side 201a. Two pivoting ends 200a extend from the first side 201a to be pivotingly connected with a base (not shown). When the cover plate 10a and the upper cover 20a are fixed to each other, the locking point 110a of the protruding block 11a is engaged with the upper cover 20a. On the side of the upper cover 20a having the pivoting end 200a, the locking point 110a is exactly engaged in the connecting portion between the pivoting end 200a and the first side 201a. If there is a tolerance in the dimension of the locking point 110a or the pivoting end 200a, the locking point 110a may interfere with the pivoting end 200a, which makes the assembly uneasy or makes the cover plate 10a unable to be fixed with the upper cover 20a. The cover plate 10a may even suffer damage. Therefore, the tolerances for the dimensions of the cover plate 10a and the upper cover 20a have to be tight, which results in a lower production yield, deterioration in the manufacturing procedure, and increase in waste products. Thus, such a conventional electrical connector is not suitable for mass production. Furthermore, since many locking points 110a are provided, both pivoting ends 200a of the upper cover 20a may scratch the locking points 110a. The scratches may negatively affect the dust-free environment necessary in the manufacturing process.

Therefore, it is necessary to design a novel electrical connector to overcome the above-mentioned problems.

SUMMARY OF THE INVENTION

The object of the present invention is to provide an electrical connector on which a cover plate is provided. During assembly, the cover plate can be fixed with the electrical connector easily. Further, the cover plate may not suffer damage easily, thereby saving working hours and facilitating mass production.

In order to achieve the above objects, the present invention provides an electrical connector for connecting a chip module to a circuit board, which includes: a fastener having an upper cover, a lower cover and a lever, the upper cover having a first side and a second side opposite to each other, the first side extending to form two pivoting ends pivotingly connecting to the lower cover, the second side extending to form a clipping portion, the lever pressing the clipping portion, the lever being pivotingly connecting to the lower cover; a connecting base for supporting the chip module and mounting it on the circuit board, the connecting base being located between the upper cover and the lower cover; a cover plate covering the upper cover, both ends of one side of the cover plate being provided with a protruding portion respectively on which a first positioning portion is provided for engaging the second side, the other side of the cover being provided with a set of second positioning portions for engaging with the first side of the upper cover.

In comparison with the current art, according to the present invention, both ends of the first side of the cover plate are provided with a protruding portion respectively. Thus, when the cover plate is fixed to the upper cover, the pivoting ends of the first side may not interfere with the upper cover due to their dimensional errors. Also, the fixation between the pivoting ends and the upper cover can be surely achieved without damaging the cover plate. Furthermore, the cover plate and the upper cover can be assembled easily. On the other hand, during the manufacturing process, the tolerances for the dimension are not tight, so that the manufacturing process is simple with less working hours, and the production yield is increased. Therefore, the present invention is suitable for mass production. Furthermore, the pivoting ends of the upper cover may not scratch the cover plate to generate scratches, so that the dust-free environment during the manufacturing process can be maintained.

In order to further understand the characteristics and technical contents of the present invention, a detailed description relating thereto will be made with reference to the accompanying drawings. However, the drawings are illustrative only, but not used to limit the scope of the present invention.

DETAILED DESCRIPTION OF THE PREFERRED EMBODIMENTS

The electrical connector of the present invention will be further described with reference to preferred embodiments thereof in conjunction with the accompanying drawings.

Figure 1:
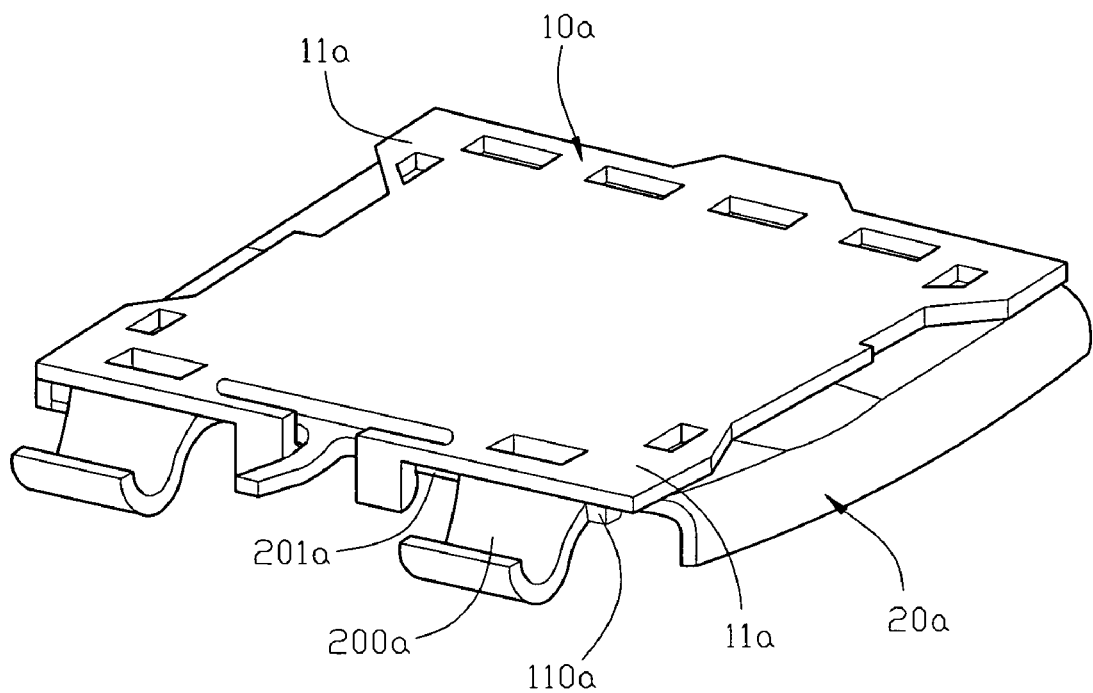
FIG. 1 is a schematic view showing the engagement of a cover plate with an upper cover of an electrical connector in prior art.
Figure 2:
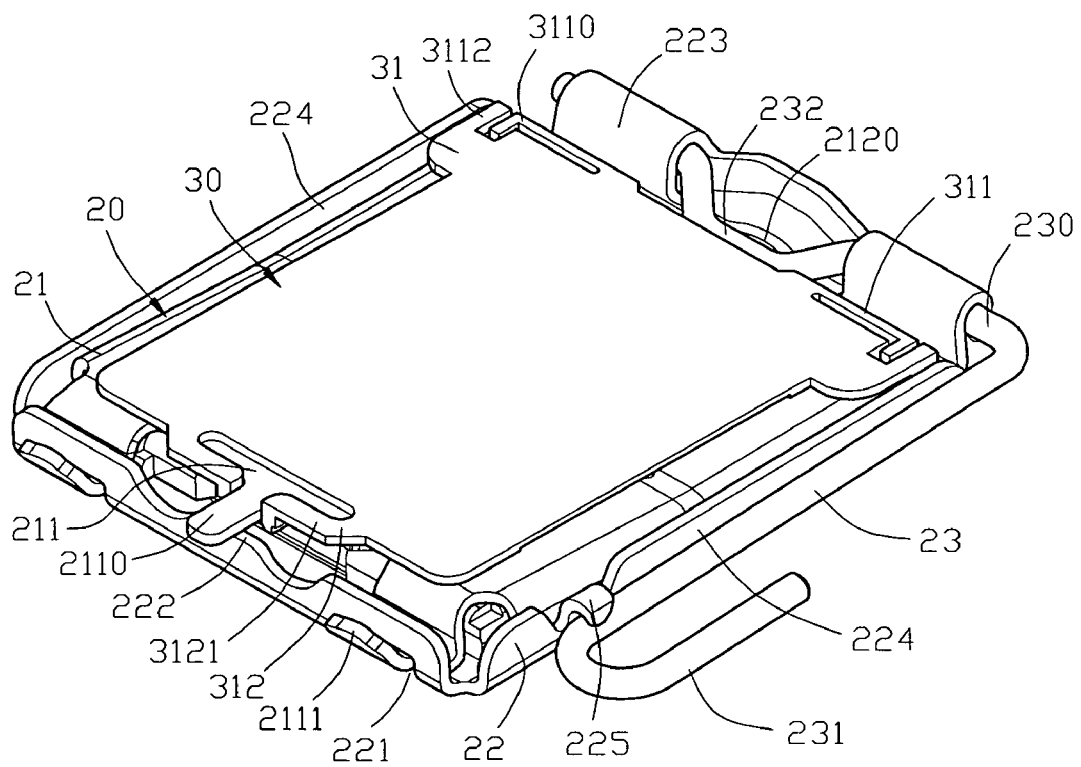
FIG. 2 is an assembled perspective view showing an electrical connector of the present invention.
Figure 3:
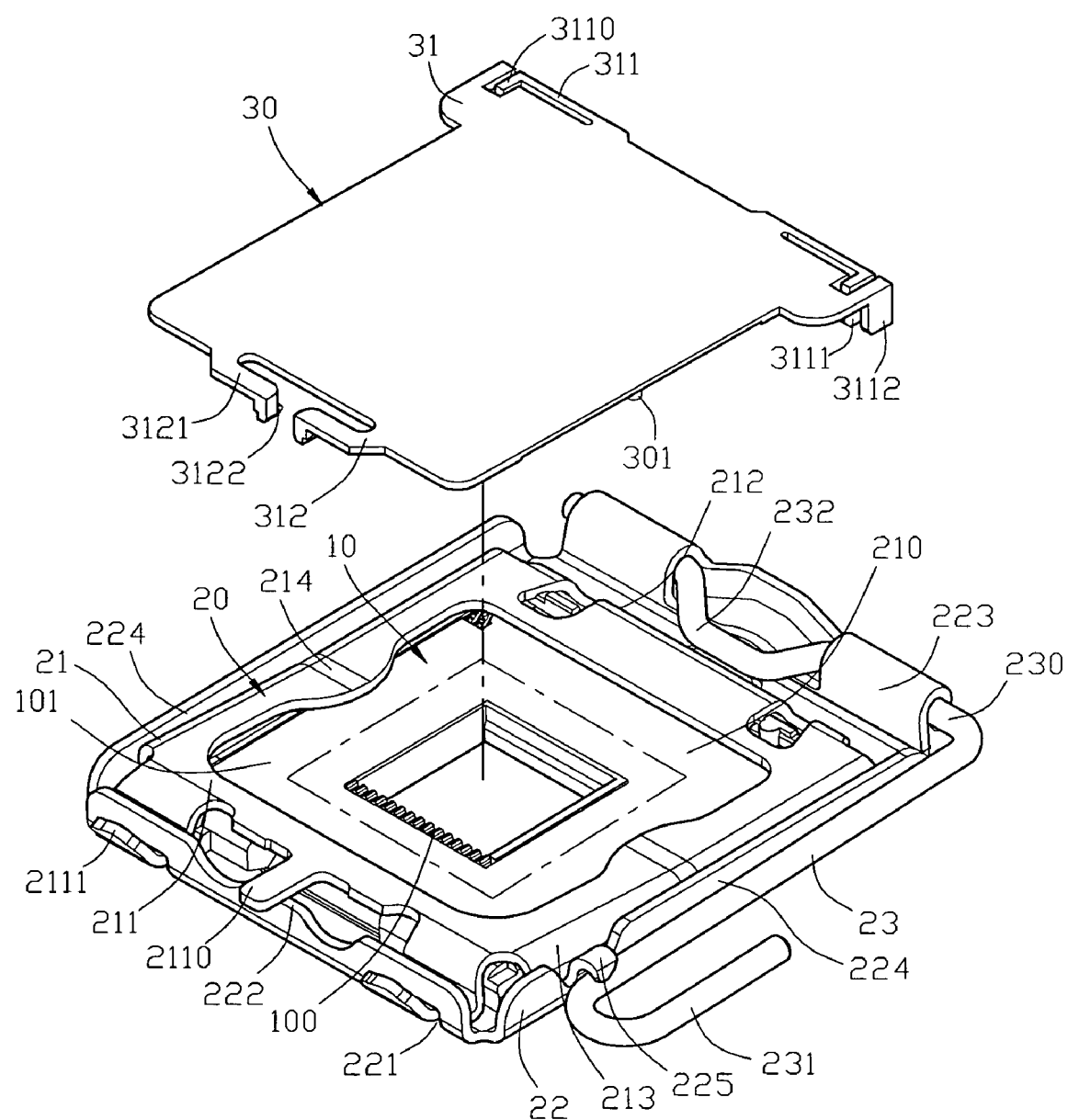
FIG. 3 is an exploded schematic view showing a cover plate and other portions of the electrical connector in FIG. 2.

Please refer to FIG. 2 and FIG. 3. The present invention provides an electrical connector, which includes a connecting base 10, a fastener 20 and a cover plate 30. The connecting base 10 includes an insulating body 101 and a plurality of conductive terminals 100 received in the insulating body 101. The connecting base 10 is used to electrically connect a chip module (not shown) to a circuit board (not shown). The fastener 20 is located outside the connecting base 10. The cover 30 is used to cover the fastener 20.

Figure 5:
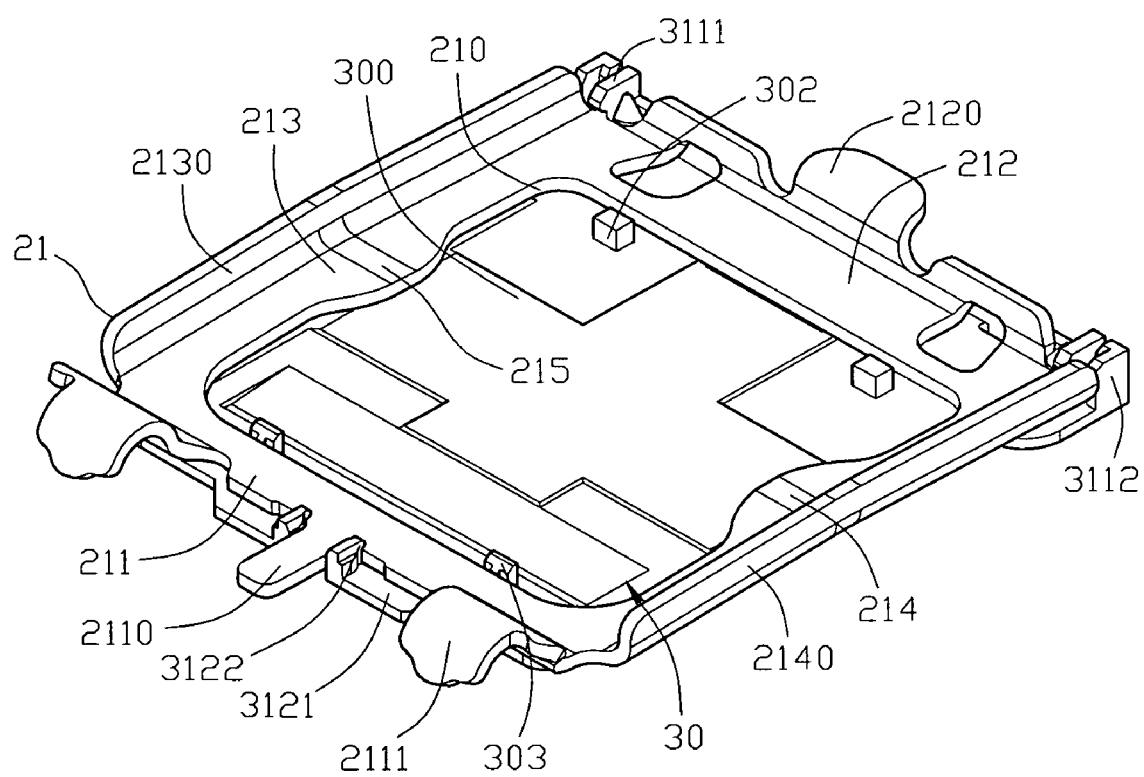
FIG. 5 is a schematic view showing the engagement between the cover plate and an upper cover of the electrical connector in FIG. 2.

Please refer to FIG. 3 and FIG. 5. The fastener 20 of the electrical connector of the present invention includes a lower cover 22, an upper cover 21 pivotingly connected with the lower cover 22, and a lever 23 for holding the upper cover 21 and the lower cover 22 together.

The middle portion of the upper cover 21 is provided with an opening 210. The periphery of the opening 210 has four sides. The middle portion of the first side 211 extends to form an extending portion 2110 that is formed into an elongated shape. On both sides of the extending portion 2110, the first side 211 further extends to form a pivoting end 2111 respectively for pivotingly connecting to the lower cover 22. The second side 212 is opposite to the first side 211. The middle portion of the second side 212 extends to form a clipping portion 2120. The third side 213 and the fourth side 214 are adjacent to the first side 211 respectively. The third side 213 and the fourth side 214 are provided with an enforcement plate 2130, 2140 respectively for increasing the strength of the upper cover 21. The middle portions of the third side 213 and the fourth side 214 are bent downwardly to form a pressing portion 215 respectively. When the chip module is connected to the electrical connector, the pressing portion 215 is able to press the chip module.

The lower cover 22 is provided on its one side corresponding to the first side 211 with two pivoting holes 221. A supporting plate 222 is provided between these two pivoting holes 221, thereby supporting the extending portion 2110. The lower cover 22 is provided on its one side corresponding to the second side 212 with two pivoting portions 223 for pivotingly connecting to the lever 23. The lower cover 22 is provided on its two sides corresponding to the third side 213 and the fourth side 214 respectively with a side plate 224. The connecting base 10 is located between the two side plates 224. One of the side plates 224 corresponding to the fourth side 214 is further provided with an engaging portion 225 for engaging the lever 23.

The lever 23 includes a shaft 230. An operating portion 231 extends vertically from the shaft 230. The middle portion of the shaft 230 is bent to form a pressing portion 232 for pressing the clipping portion 2120 of the upper cover 21.

Figure 4:
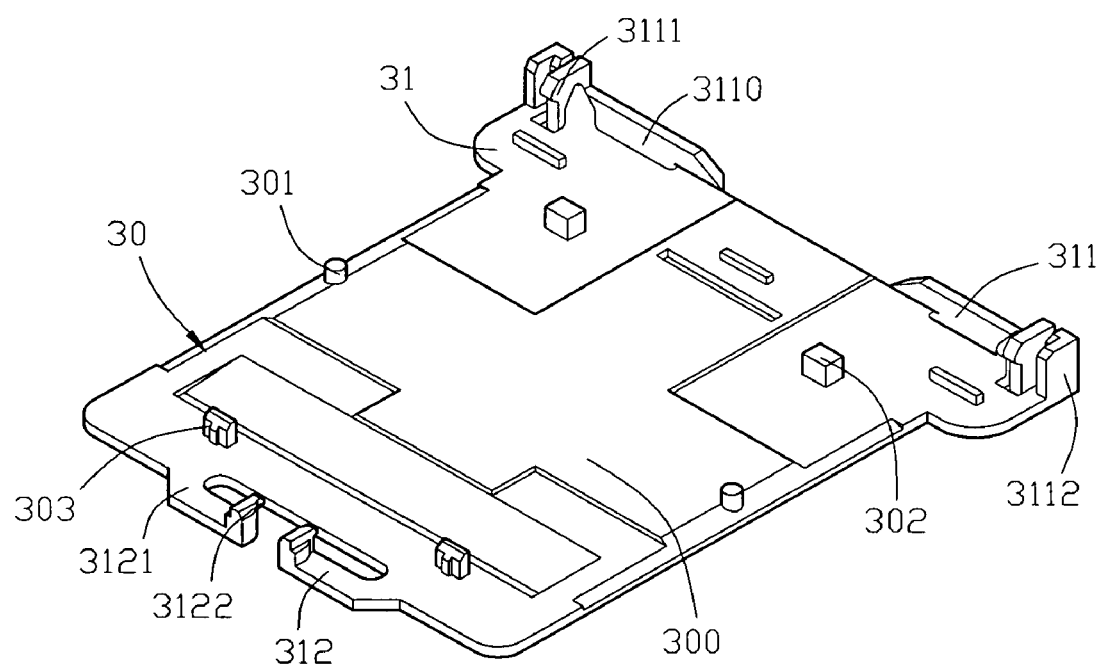
FIG. 4 is a perspective view showing the cover plate of the electrical connector in FIG. 2.

Please refer to FIG. 3 and FIG. 4. The cover plate 30 is larger than the opening 210 of the upper cover 21. The surface of the cover plate facing the upper cover 21 is referred to as a bottom surface 300. Both ends of the cover plate 30 on its one side corresponding to the second side 212 are provided with a protruding portion 31 respectively. The protruding portion 31 is provided with a first positioning portion 311 for engaging with the second side 212. Each first positioning portion 311 includes an L-shaped cantilever 3110 and a first locking block 3111 at the distal end of the cantilever 3110. The first locking block 3111 is engaged with the second side 212 of the upper cover 21. During the engagement, the cantilever 3110 will be deformed slightly toward the outside. After the first locking block 3111 is engaged with the second side 212, the cantilever 3110 will recover its original state. The cantilever of the first positioning portion 311 is designed to increase the elasticity of the first locking block 3111, thereby preventing the first locking block 3111 from suffering damage. The protruding portion 31 is provided with two restricting portions 3112. The two restricting portions 3112 are located outside the cantilever 3110 respectively, thereby preventing the cantilever 3110 from being deformed outwardly so much as to be broken. On one side corresponding to the first side 211, the cover 30 extends to form a set of second positioning portions 312 for engaging with the first side 211. Each of the second positioning portions 312 is provided with an extending arm 3121. Each of the extending arms 3121 is provided with a second locking block 3122 for engaging with the first side 211. On the side adjacent to the first positioning portion 311, the bottom surface 300 of the cover plate 30 is provided with two protruding blocks 302. The protruding block 302 enters the opening 210 of the upper cover 21 to abut on the chip module (not shown). The bottom surface 300 of the cover plate 30 adjacent to its both sides is provided with a supporting point 301 respectively. The two supporting points 301 abut on the third side 213 and the fourth side 214 respectively. The middle portions of the third side 213 and the fourth side 214 are bent downwardly. The supporting point 301 is located exactly at the above-mentioned bending portion. On one side of the bottom surface 300 adjacent to the second positioning portion 312 is provided with two retaining blocks 303. The retaining block 303 enters the opening 210 of the upper cover 21 and is engaged with the edge of the opening 210 adjacent to the first side 211.

Please refer to FIG. 2 and FIG. 5. The assembling process of the present invention is described as follows.

First, the two pivoting ends 2111 of the upper cover 21 are pivotingly connected with the two pivoting holes 221 of the lower cover 22. At this time, the stripe-shaped extending portion 2110 of the upper cover 21 is supported exactly on the supporting plate 222 of the lower cover 22, thereby allowing the pivoting rotation of the upper cover 21.

Next, the shaft 230 of the lever 23 is pivotingly connected to the pivoting portion 223 of the lower cover 22. Via the driving of the operating portion 231, the lever 23 can be pivotingly rotated with respect to the lower cover 22.

Then, the cover plate 30 is mounted on the upper cover 21, so that the second locking block 3122 is engaged with the first side 211. In this way, the strip-shaped extending portion 2110 of the upper cover 21 is located between a set of the second positioning portions 312, so that the two retaining blocks 303 can be retained by the edges of the first side 211 adjacent to the opening 210, thereby engaging the first locking block 3111 with the second side 212.

At this time, the electrical connector is completely assembled. The two supporting points 301 abuts on an upper surface (FIG. 6) on the third side 213 and the fourth side 214 of the upper cover 21 with the two protruding blocks 302 entering the opening 210 of the upper cover 21.

In operation, at first, the operating portion 231 of the lever 23 is moved out of the engaging portion 225, thereby lifting the operating portion 231. In this way, the shaft 230 rotates in the pivoting portion 223 and causes the pressing portion 232 to move away from the clipping portion 2120 of the upper cover 21. As a result, the pressing of the lever 23 to the upper cover 21 can be released. Thereafter, the upper cover 21 is pulled upwardly to pivotingly rotate around the pivoting end 2111 of the first side 211 to make it open. Then, the chip module (not shown) is disposed in the connecting base 10 of the lower cover 22 and the upper cover 21 is locked. Finally, the operating portion 231 of the lever 23 is rotated, so that the pressing portion 232 can press on the clipping portion 2120 of the upper cover 21 due to the driving of the shaft 230. As a result, the operating portion 231 of the lever 23 is engaged below the engaging portion 225. At this time, the top surface of the chip module (not shown) abuts on the protruding block 302 of the cover plate 30. A portion of the chip module (not shown) is exposed to the opening 210, so that the cover plate 30 can fall off from the upper cover 21, thereby facilitating the removal of the cover plate 30.

According to the above, the electrical connector of the present invention has advantages as follows.

1. In the electrical connector of the present invention, only both ends of the side of the cover plate 30 corresponding to the first side 211 are provided with protruding portions 31. Thus, in comparison with the current art in which two opposite sides of the cover plate are provided with a set of protruding portions respectively, when the cover plate 30 is assembled with the upper cover 21, at the first side 211, the locking block 3111 can be surely fixed to the pivoting end 2111 regardless of their dimensional errors. Furthermore, in manufacturing the cover plate 30 and the upper cover 21, the tolerances for their dimensions will be not tight. Therefore, the production yield can be increased and the manufacturing process can be accelerated. Thus, the present invention is suitable for mass production.

2. In to the electrical connector of the present invention, when the cover plate 30 is fixed to the upper cover 21, the scratches generated in the prior art by the pivoting ends scratching on the locking points can be avoided, so that a dust-free working environment can be maintained, since the first side 211 of the upper cover 21 does not have protruding portions 31.

Figure 6:
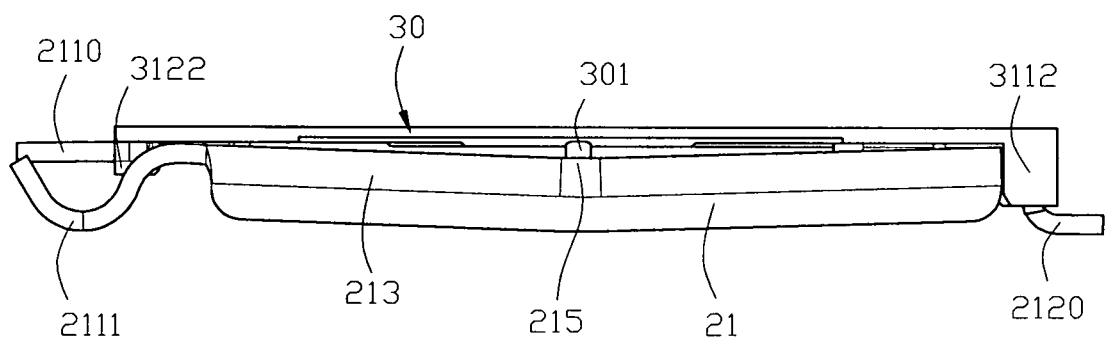
FIG. 6 is a schematic view showing the engagement between the cover plate and the upper cover of the electrical connector in FIG. 5 from another viewing angle.

3. As shown in FIG. 6, after the assembly is completed, the supporting points 301 on the cover plate 30 can abut on the upper cover 21, thereby preventing the collapse of the cover plate 30 and also increasing the friction on the third side 213 and the fourth side 214 of the upper cover 21. Thus, the upper cover 21 can be prevented from moving underneath the cover plate 30.

4. In the electrical connector of the present invention, the cover plate 30 is provided with a protruding block 302. After a chip module is disposed in the electrical connector, the cover plate 30 can be ejected automatically due to the abutting action of the chip module, thereby facilitating the detachment of the cover plate.

5. In the electrical connector of the present invention, the cover plate 30 is not provided with holes, thereby reducing the possible entrance of dust. Therefore, poor contact caused by the presence of dust can be avoided.

What is claimed is:

1. An electrical connector for connecting a chip module to a circuit board, comprising:

a fastener having an upper cover, a lower cover and a lever, the upper cover having a first side and a second side opposite to each other, the first side extending to form two pivoting ends pivotingly connected to the lower cover, the second side extending to form a clipping portion, the lever pressing the clipping portion, the lever being pivotingly connected to the lower cover;

a connecting base for supporting the chip module and mounting it on the circuit board, the connecting base being located between the upper cover and the lower cover;

a cover plate covering the upper cover, both ends of one side of the cover plate being provided with a protruding portion, on which a first positioning portion is provided for engaging the second side of the upper cover, the first positioning portion having a cantilever and a first locking block located at a distal end of the cantilever, a restricting portion being provided outside of the first positioning portion, the other side of the cover plate being provided with a set of second positioning portions for engaging with the first side of the upper cover.

2. The electrical connector according to claim 1, wherein the restricting portion is disposed on the cover plate laterally outside the first locking block.

3. The electrical connector according to claim 1, wherein the second positioning portion is provided on one side of the cover plate corresponding to the first side, and each of the second positioning portions is provided with an extending arm.

4. The electrical connector according to claim 3, wherein the extending arm of the second positioning portion is provided with a second locking block for engaging with the first side.

5. The electrical connector according to claim 1, wherein the bottom surface of the cover plate is provided with a plurality of supporting points for abutting on the upper cover.

6. The electrical connector according to claim 5, wherein the middle portions of the two sides on the upper cover adjacent to the first side are bent downwardly to form a pressing portion respectively for pressing the chip module, the supporting points abut on an upper surface of the pressing portion respectively.

7. The electrical connector according to claim 1, wherein the bottom surface of the cover plate is provided with at least one protruding block for abutting on the chip module.

8. The electrical connector according to claim 1, wherein the bottom surface of the cover plate is provided with retaining blocks for engaging with inner edges of the first side.

* * * * *